United States Patent [19]
Manning

[11] Patent Number: 6,014,759
[45] Date of Patent: Jan. 11, 2000

[54] METHOD AND APPARATUS FOR TRANSFERRING TEST DATA FROM A MEMORY ARRAY

[75] Inventor: Troy A. Manning, Meridian, Id.

[73] Assignee: Micron Technology, Inc., Boise, Id.

[21] Appl. No.: 08/874,315

[22] Filed: Jun. 13, 1997

[51] Int. Cl.[7] .................................................... G11C 8/00
[52] U.S. Cl. ........................... 714/42; 714/160; 714/718; 365/201; 365/189.05
[58] Field of Search ...................... 395/183.18; 371/21.1; 365/201, 189.05; 714/160, 718, 42

[56] References Cited

U.S. PATENT DOCUMENTS

| | | | |
|---|---|---|---|
| Re. 35,934 | 10/1998 | Takai | 365/189.05 |
| 4,096,402 | 6/1978 | Schroeder et al. | 307/362 |
| 4,404,474 | 9/1983 | Dingwall | 307/260 |
| 4,611,337 | 9/1986 | Evans | 377/123 |
| 4,638,187 | 1/1987 | Boler et al. | 307/451 |

(List continued on next page.)

FOREIGN PATENT DOCUMENTS

| | | |
|---|---|---|
| 0 450 871 A2 | 10/1991 | European Pat. Off. . |
| 0 655 741 A2 | 5/1995 | European Pat. Off. . |
| 0 680 049 A2 | 11/1995 | European Pat. Off. . |
| 0 692 872 A2 | 1/1996 | European Pat. Off. . |
| 2-112317 | 4/1990 | Japan . |
| 4-135311 | 8/1992 | Japan . |
| 5-136664 | 1/1993 | Japan . |

OTHER PUBLICATIONS

Taguchi, M. et al., "A 40–ns 64–Mb DRAM with 64–b Parallel Data Bus Architecture", IEEE Journal of Solid–State Circuits, vol. 26, Nov. 1991, pp. 1493–1497.

Descriptive literature entitled, "400 MHz SLDRAM, 4M x 16 SLDRAM Pipelined, Eight Bank, 2.5 V Operation," pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1–56.

Primary Examiner—Ly V. Hua
Attorney, Agent, or Firm—Dorsey & Whitney LLP

[57] ABSTRACT

A memory device includes an output data path that uses single-ended data in conjunction with a flag signal. The output data path transfers data from an I/O circuit coupled to a memory array to an output tri-state buffer. A comparing circuit compares data from the I/O circuit to a desired data pattern if the data does not match the desired pattern outputs the flag signal. The flag signal is input to the output buffer and the output buffer outputs a tri-state condition on the data bus. Since the flag signal corresponds to more than one data bit, the tri-state condition of the output buffer is held for more than one tick of the data clock, rather than only a single tick. Consequently, the tri-state condition remains on the bus for sufficiently long that a test system can detect the tri-state condition even at very high clock frequencies.

26 Claims, 6 Drawing Sheets

U.S. PATENT DOCUMENTS

| | | | |
|---|---|---|---|
| 4,789,796 | 12/1988 | Foss | 307/443 |
| 4,884,270 | 11/1989 | Chiu et al. | 371/21.2 |
| 4,928,281 | 5/1990 | Kurosawa et al. | 371/51.1 |
| 4,958,088 | 9/1990 | Farah-Bakhsh et al. | 307/443 |
| 4,984,204 | 1/1991 | Sato et al. | 365/189.11 |
| 5,111,435 | 5/1992 | Miyamoto | 365/230.06 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,254,883 | 10/1993 | Horowitz et al. | 307/443 |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,311,481 | 5/1994 | Casper et al. | 365/230.06 |
| 5,321,368 | 6/1994 | Hoelzle | 328/63 |
| 5,347,177 | 9/1994 | Lipp | 307/443 |
| 5,347,179 | 9/1994 | Casper et al. | 307/451 |
| 5,361,002 | 11/1994 | Casper | 327/530 |
| 5,383,157 | 1/1995 | Phelan | 365/201 |
| 5,387,809 | 2/1995 | Yamagishi et al. | 257/203 |
| 5,390,308 | 2/1995 | Ware et al. | 395/400 |
| 5,400,283 | 3/1995 | Raad | 365/203 |
| 5,438,545 | 8/1995 | Sim | 365/189.05 |
| 5,440,260 | 8/1995 | Hayashi et al. | 327/278 |
| 5,457,407 | 10/1995 | Shu et al. | 326/30 |
| 5,467,473 | 11/1995 | Kahle et al. | 395/800 |
| 5,471,591 | 11/1995 | Edmondson et al. | 395/375 |
| 5,473,575 | 12/1995 | Farmwald et al. | 365/230.06 |
| 5,475,642 | 12/1995 | Taylor | 365/203 |
| 5,483,497 | 1/1996 | Mochizuki et al. | 365/230.03 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,590,073 | 12/1996 | Arakawa et al. | 365/185.08 |
| 5,619,473 | 4/1997 | Hotta | 365/238.5 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,871 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,655,105 | 8/1997 | McLaury | 395/496 |
| 5,668,763 | 9/1997 | Fujioka et al. | 365/200 |
| 5,694,065 | 12/1997 | Hamasaki et al. | 327/108 |
| 5,737,276 | 4/1998 | Shin et al. | 365/230.08 |
| 5,831,929 | 11/1998 | Manning | 365/233 |
| 5,847,577 | 12/1998 | Trimberger | 326/38 |
| 5,854,911 | 12/1998 | Watkins | 395/383 |

METHOD AND APPARATUS FOR TRANSFERRING TEST DATA FROM A MEMORY ARRAY

TECHNICAL FIELD

The present invention relates to integrated memory devices and more particularly to data transfer in memory devices.

BACKGROUND OF THE INVENTION

Within a high-speed memory system 38, shown in FIG. 1, a synchronous memory device 40 performs operations, such as reading from or writing to a memory array 46, in a predetermined sequence. These operations are generally performed responsive to commands COM issued by a command generator, such as a memory controller 44. Timing of the commands and other signals outside of the memory device 40 is determined by an external clock signal CKEXT and a data clock DCLK that are produced by the memory controller 44.

It will be understood by one skilled in the art that the block diagram of FIG. 1 omits some signals applied to the memory device 40 for purposes of brevity. Also, one skilled in the art will understand that although in the exemplary embodiment disclosed herein, the commands COM are control data within a control data packet, in other applications the commands may be composed of a combination of command signals. In either case, the control data or combination of signals is commonly referred to as a command. The exact nature of these packets or signals will depend on the nature of the memory device 40, but the principles explained herein are applicable to many types of memory devices, including packetized DRAMs and other synchronous DRAMs.

Within the memory device 40, operations are controlled by a logic control circuit 42 responsive to the commands COM. In the packetized memory system 38 of FIG. 1, the logic control circuit 42 includes a command sequencer and decoder 45 and command latches 50. In a conventional memory system, the logic control circuit 42 may be conventional DRAM control logic.

Timing of operations within the memory device 40 is controlled by an internal clock signal CKINT that is produced by a delay-locked loop 62 and a switching circuit 63 responsive to the external clock signal CKEXT. Timing of data being latched into the memory device 40 is controlled by a write latch signal LATCHW produced by a pulse generator 61 responsive to the data clock DCLK. Data is transferred out of the memory device 40 through an output circuit 81 responsive to an internal read latch signal LATCHR.

Usually, operations within the memory device 40 must be synchronized to operations outside of the memory device 40. For example, commands and data are transferred into the memory device 40 on command and data busses 48, 49, respectively, by clocking a command latch/buffer 50 and input data latches 52 according to the internal clock signal CKINT and the internal write latch signal LATCHW. However, as noted above, command timing on the command bus 48 and data timing on the data bus 49 are controlled by the external clock signal CKEXT and the data clock DCLK, respectively. Therefore, to transfer commands and data from the busses 48, 49 at the proper times relative to the external clock signal CKEXT, the internal clock signal CKINT is synchronized to the external clock signal CKEXT and the write latch signal LATCHW is synchronized to the data clock DCLK.

To establish synchronization of the internal and external timing, the memory device 40 produces several phase-shifted clock signals CKINT-$\phi_X$ at respective taps of the delay-locked loop 62 responsive to the external clock signal CKEXT. Each of the phase-shifted clock signals CKINT-$\phi_X$ has a respective phase-shift $\phi_X$ relative to the external clock signal CKEXT. In response to commands COM from the memory controller 44, the logic control circuit 42 activates the switching circuit 63 to select one of the phase-shifted clock signals CKINT-$\phi_1$ as the internal clock signal CKINT. The selected phase-shifted clock signal CKINT-$\phi_1$ has a phase-shift $\phi_1$ corresponding to delays within the memory device 40 and propagation delays of the external clock signal CKEXT. Because the shifted internal clock signal CKINT-$\phi_1$ is synchronized to the external clock signal CKEXT, operations within the memory device 40 can be synchronized to commands and data arriving on the command bus 48 and data bus 49.

The command packet contains control and address information for each memory transfer, and a command flag signal CDFLAG identifies the start of a command packet which may include more than one 10-bit packet word. In fact, a command packet is generally in the form of a sequence of 10-bit packet words on the 10-bit command bus 48. The command latch/buffer 50 receives the command packet from the bus 48, and compares at least a portion of the command packet to identifying data from an ID register 47 to determine if the command packet is directed to the memory device 40 or some other memory device. If the command buffer determines that the command packet is directed to the memory device 40, it then provides a command word to the command decoder and sequencer 45. The command decoder and sequencer 45 generates a large number of internal control signals to control the operation of the memory device 40 during a memory transfer.

An address capture/sequencer/refresh circuit 51 also receives the command words from the command bus 48 and produces a 3-bit bank address, a 10-bit row address, and a 7-bit column address corresponding to address information in the command or to addresses from a refresh counter (not shown).

One of the problems of conventional DRAMs is their relatively low speed resulting from the time required to precharge and equilibrate circuitry in the DRAM array. The packetized DRAM 40 shown in FIG. 2 largely avoids this problem by using a plurality of memory banks 46, in this case eight memory banks 46a–h. After a memory is read from one bank 46, the bank 46 can be precharged while the remaining banks 46b–h are being accessed. Each of the memory banks 46a–h receive a row address from a respective row latch/decoder/driver 59a–h. All of the row latch/decoder/drivers 59a–h receive the same row address from the address capture/sequencer/refresh circuit 51. However, only one of the row latch/decoder/drivers 46a–h is active at any one time as determined by bank control logic 65 as a function of bank data from the address capture/sequencer/refresh circuit 51.

The 7-bit column address is applied to a column latch/decoder 66 which supplies I/O gating signals to an I/O interface 54. The I/O interface 54 interfaces with columns of the memory banks 46a–h through sense amplifiers 75.

To write data to the memory device 40, data are received at a latching circuit 52 responsive to the write latch signal LATCHW. The data are then transferred to a write latch/register 53 where the data are made available to the I/O interface 54. The sense amplifiers 75 can then provide the data to the appropriate location indicated by the row, bank, and column addresses.

For reading data from the memory device 40, the I/O interface 54, shown in FIGS. 1 and 2, under control of the logic control circuit 42 prefetches 64 bits of data from a memory array 46 and transfers the prefetched data to the output circuit 81 responsive to the internal clock signal CKINT. The I/O interface 54 includes a set of sense amplifiers 75 for each complementary digit line pair. For example, an array having 512 digit line pairs would include 512 sense amplifiers 75 that read data from the digit lines and provide complementary output data in response. A set of multiplexers 91 receive the complementary data from the sense amplifiers 75 and, responsive to a control signal from the logic control circuit 42, output the 64 bits of complementary data. As shown in FIG. 2 for the example described above of a 512 column array, the multiplexers 91 would be 8-to-1 multiplexers so that each multiplexer 91 would output data from one of 8 digit line pairs.

The output data from each multiplexer 91 in the multiplexer bank are then applied to a line driver 77 which is typically formed from a DC sense amplifier or a helper flip-flop. The line driver converts the low drive current signals from the sense amplifiers 75 and multiplexer 91 to corresponding signals with higher current capability. The line drivers 77 output the complementary data on a corresponding complementary pair of lines 85 that carry the data from the line drivers 77 to the output circuit 81 where the data are received by a second bank of multiplexers 93. The second bank of multiplexers 93 multiplexes the 64 bits by a factor of four to provide four sets of 16 bits that are input to a series of four pairs of 16-bit output registers 79. Since there are complementary data signals for each bit, each bit utilizes two registers (a bit register and a complementary bit register). As best seen in FIG. 2, for each complementary line pair, the output circuit 81 includes eight output registers that receive the data responsive to the internal clock signal CKINT. The data in the eight output registers are latched into a tri-state output buffer 83 by the read latch signal LATCHR and each tri-state output buffer 83 outputs four bits of output data to respective lines of the 16 line data bus 49. The read latch signal LATCHR has a frequency twice that of the internal clock signal CKINT because the pulses of the read latch signal LATCHR are produced by the output vernier 57 responsive to both rising and falling edges of the internal clock signal CKINT. Thus, the data are transferred from the eight output registers 79 to the data bus 49 over a period about equal to two cycles of the internal clock signal CKINT.

During testing of the memory device, data are written to the memory array 46 in a selected test pattern. Data are then read from the memory array 46 and compared to the selected test pattern. If data read from a location in the array 46 does not match the data written to the location, the tri-state buffer 83 is driven to a tri-state condition. In the tri-state condition, the buffer 83 presents a high impedance, floating output to the data bus 49. A test head 110 indicates the tri-state condition to test circuitry 112 that identify the erroneous data. A redundant row or column can then replace the row or column having the defective location.

Because the memory device 40 is operated and tested at high speeds, the time during which the tri-state condition is present on the data bus 49 can be very short. At very high frequencies, capacitance and inductance of the data bus 49 and the test head 110 can make the tri-state condition very difficult to detect.

Another problem arises from the number of lines carrying data. Because each bit of data occupies two conductors, the device described above employing 64 data bits and a 16-bit data bus utilizes 128 lines to transfer 64 data bits from the line drivers 77 to the output latch circuit 81. Each of these lines occupies valuable space on the substrate containing the memory array 46 and complicates routing of lines.

SUMMARY OF THE INVENTION

An I/O circuit in a memory device reads data from a memory array and a comparing circuit compares the data to a desired pattern. If the read data is incorrect, the comparing circuit outputs a flag signal to a tri-state output buffer. The tri-state output buffer produces an error indicator in response. In one embodiment, the error indicator is a high-impedance floating signal that is detected by a test system. The flag signal disables the output buffer for a plurality of clock transitions so that the tri-state indicator is present for a sufficiently long period for the test system to detect the tri-state indicator.

In one embodiment, data from the memory array is read by sense amplifiers that produce complementary data in response. The complementary data are compressed by multiplexers in response to selected bits of an address signal to produce 64 bits of complementary data. The 64 bits of complementary data are applied to line drivers formed from DC sense amplifiers and helper flip-flops. In response to the complementary data, the DC sense amplifiers and helper flip-flops output single-ended data.

Because the flag signal corresponds to a plurality of data bits, the plurality of data bits and the error signal can be transmitted on fewer conductors rather than requiring a pair of conductors for each data bit, therefore reducing the number of conductors between the I/O circuit and the tri-state buffer. Also, because the error signal corresponding to a plurality of data bits can be stored in a single register, the number of output registers is reduced.

DETAILED DESCRIPTION OF THE INVENTION

Figure 1:
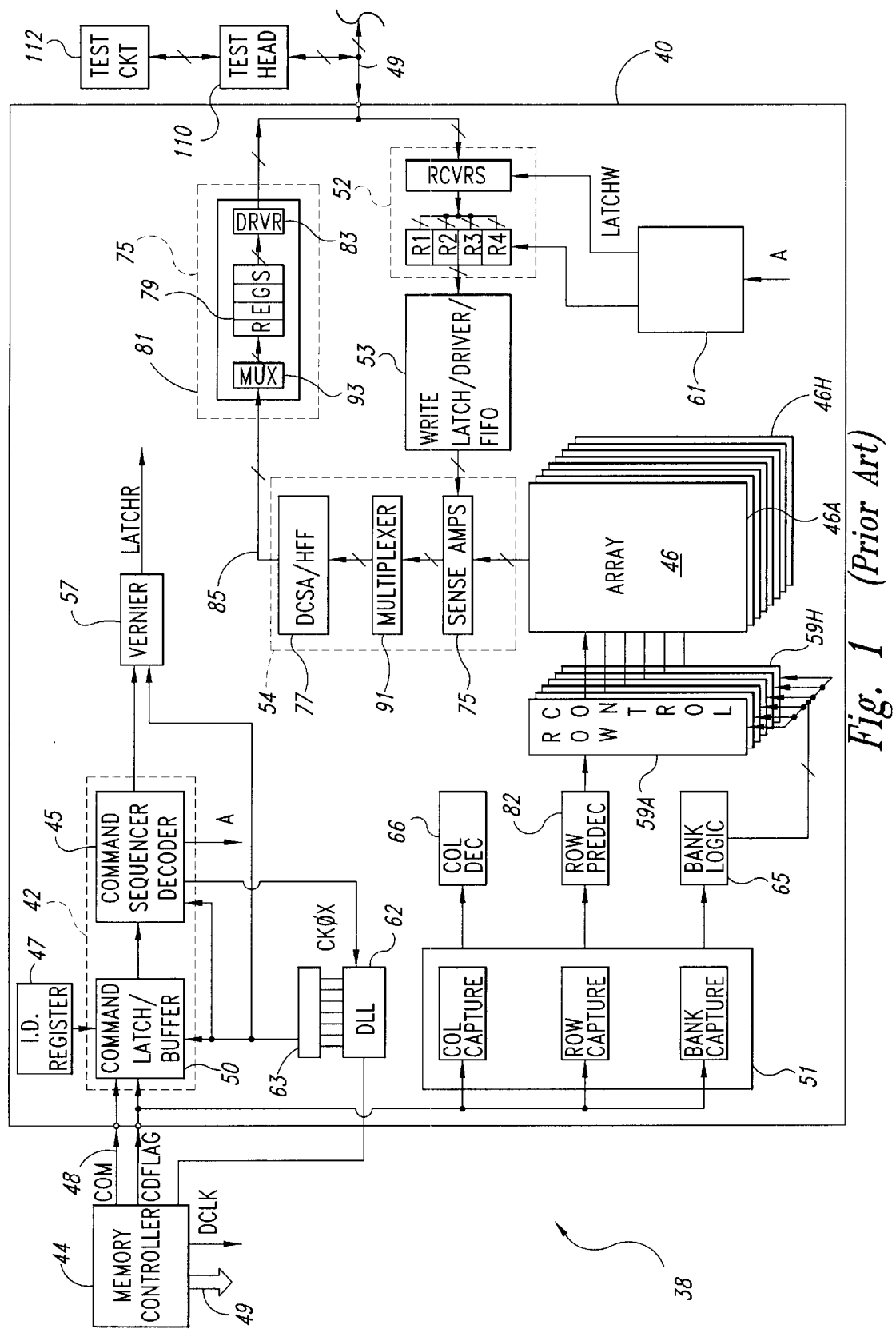
FIG. 1 is a block diagram of a prior art memory device driven by a memory controller.
Figure 3:
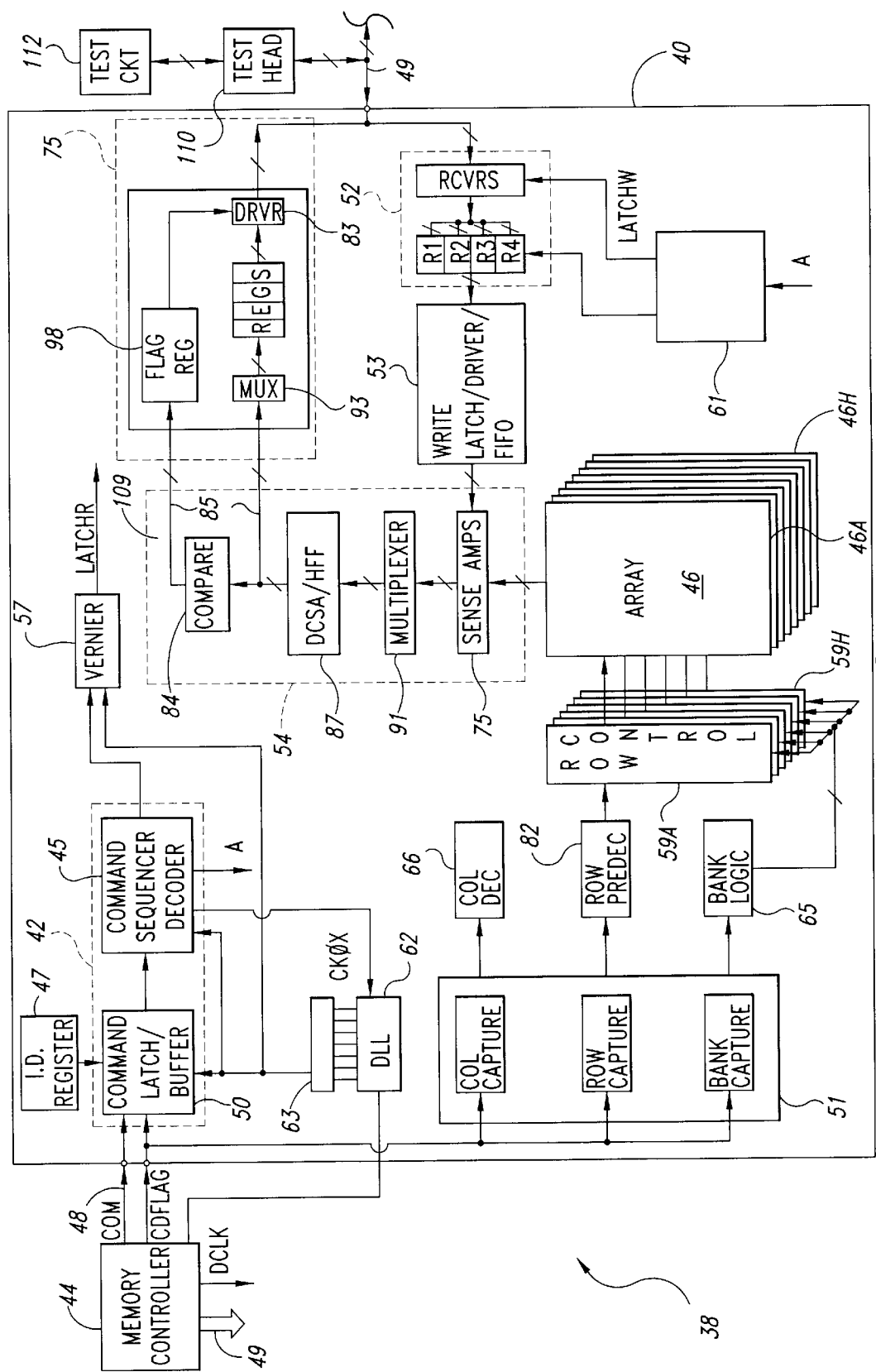
FIG. 3 is a block diagram of a memory device according to the invention including a compare circuit linked to an I/O gating circuit.

As shown in FIG. 3, a packetized memory system 68 includes a memory device 70 that operates under control of the memory controller 44. The memory device 70 includes several of the same components as the memory device of FIG. 1, such as the memory array 46, the delay locked loop 62, and the output vernier 57, where common elements are numbered identically. Like the embodiment of FIG. 1, the memory controller 44 controls the memory device 70 through commands COM and the external clock signal CKEXT. The memory controller 44 also provides data to the memory device 70 over the 16-bit data bus 49, synchronously with the data clock signal DCLK.

Within the logic control circuit 42, the command latches 50 receive the commands COM and forward them to the sequencer and decoder 45. The logic control circuit 42 establishes timing of operations within the memory device 70 responsive to the decoded commands COM and the internal clock signal CKINT. Because the memory device 70 is a packetized memory, the logic control circuit includes the command sequencer and decoder 45. As before, one skilled in the art will recognize that principles described herein are also applicable to other synchronous and asynchronous memory devices. For example, where the memory device is a synchronous memory, the logic control circuit may be a conventional control circuit.

The logic control circuit 42 activates the command latches 50 on edges of the internal clock signal CKINT to latch commands COM that arrive on the command bus 48 at edges of external clock signal CKEXT. Where the commands COM relate to a data transfer operation such as a read or a write, the sequencer and decoder 45 activates row address capture circuitry 51 and column and bank address capture circuitry 53 to capture row, column and bank address information from the command packet. The captured row address is applied to a row control circuit 59 that activates a row corresponding to the captured row address. The captured column address is applied to an I/O interface 54 that includes sense amplifiers 75, multiplexers 91, line drivers 87 and compare circuits 89. The I/O interface 54 is coupled to the data bus 49 by an output data path 75 that includes data lines 107, flag lines 109, and an output circuit 81. For clarity of presentation, the output data path 75 is presented as including only a single set of output registers 79. However, a variety of other data path structures may be utilized in accordance with the invention. For example, the memory device 70 could include input and output data sequencers that employ a plurality of registers to stagger transfers of data DA between the data bus 49 and the I/O interface 54. Control of timing in such data sequencers is described in U.S. patent application Ser. No. 08/833,376, filed Apr. 4, 1997, of Manning which is commonly assigned herewith and which is incorporated herein by reference.

Data transfer operations in the output data path 75 are controlled by the latch signal LATCHR from the output vernier 57. As noted above, the latch signal LATCHR is produced responsive to both rising and falling edges of the internal clock signal CKINT. Consequently, two pulses of the latch signal LATCHR typically occur during a single cycle of the internal clock signal CKINT.

Figure 4:
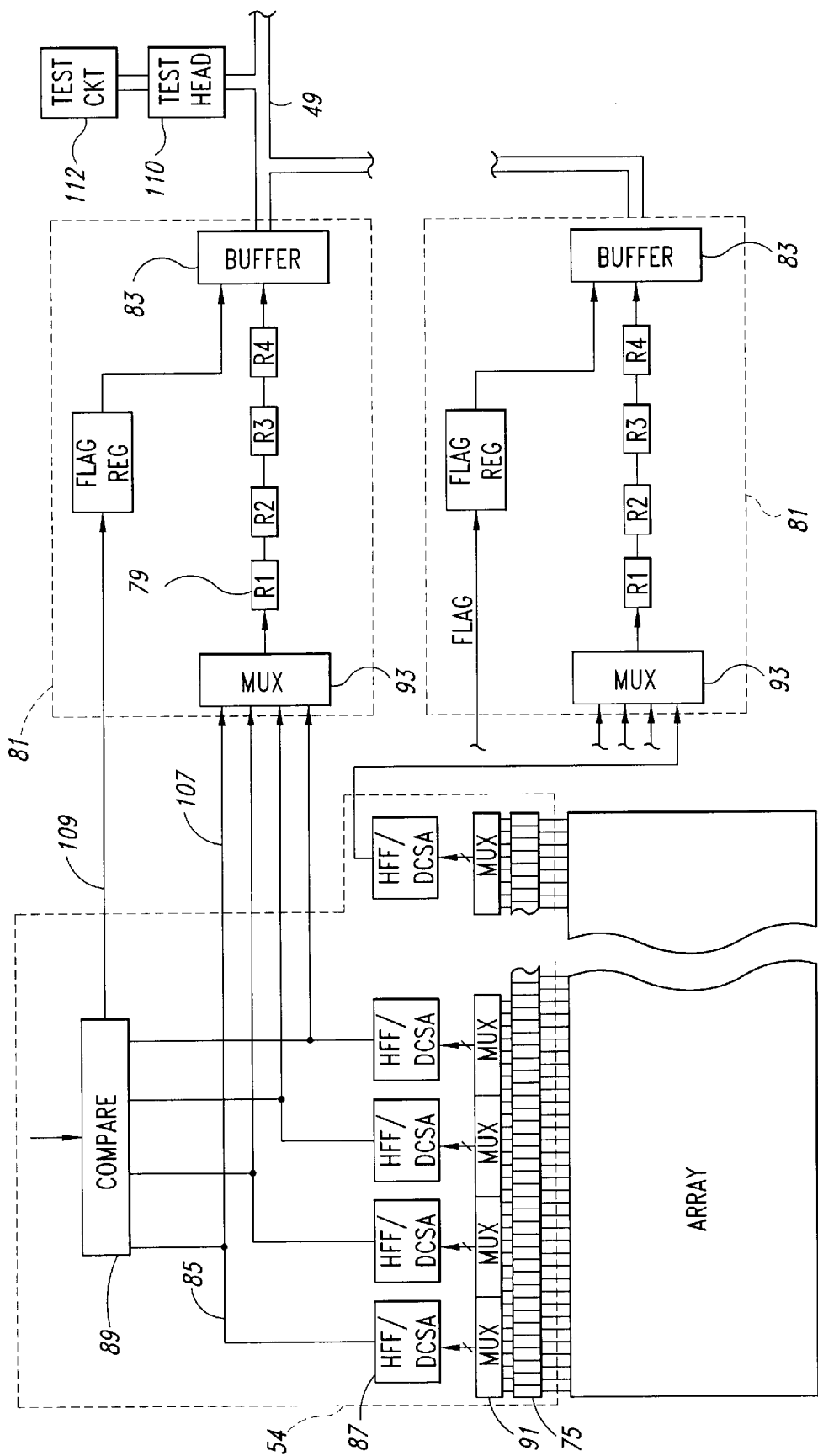
FIG. 4 is a block diagram of an array, I/O gating circuit, comparator, and an output data path in the memory device of FIG. 3 where selected sets of data lines are accompanied by a corresponding flag line from the compare circuit.

Referring to FIG. 4, the I/O interface 54 begins at the array 46 where the sense amplifiers 75 generate complementary data from the corresponding digit lines and provide the data to the bank of multiplexers 91. The multiplexers 91 receive 3 bank address bits $A_{N-2}$, $A_{N-1}$, $A_N$ from the column and bank address capture circuit 53 and in response, each multiplexer 91 outputs complementary data from one of the 8 corresponding sense amplifiers 75 so that the 512 outputs from the sense amplifiers 75 are multiplexed by a factor of 8 to produce 64 outputs. The 64 outputs from the multiplexers 91 drive a set of line drivers 87. Unlike the line drivers 77 of FIG. 1, the line drivers 87 do not output complementary data so that the logic state is determined by the voltage of the single conductor relative to a reference voltage. For example, a high voltage may represent a "1," while a low voltage may represent a "0."

Within the I/O interface 54, a respective comparing circuit 89 is coupled to each group of four line drivers 87. Each comparing circuit 89 compares the 4 bits of output data from its respective line drivers 87 to a specified bit pattern to see if any of the data are incorrect. For example, if the specified bit pattern is "1111," the comparing circuit 89 determines that the data are defective if any of the bits is "0." One skilled in the art will recognize that the comparing circuits 89 can be implemented with a variety of circuit structures. For example, where the desired bit pattern is "1111" the comparing circuit 89 may use a 4-input NAND gate to verify that all of the bits are "1s."

In addition to monitoring the data bits, the comparing circuit 89 also monitors command signals from the logic control circuit 42, such as a write enable signal WE, to determine if reading is disabled. In response to its detection of a non-reading mode or detection of an incorrect data pattern, the comparing circuit 89 outputs a flag signal FLAG. Because the comparing circuit 89 monitors the outputs of four line drivers 87, the flag signal FLAG remains active for two complete cycles of the internal clock signal CKINT, which corresponds to reading of 64 bits (four sets of 16 bits) from the memory array 42. Thus, for each set of 4 bits of data, the flag signal FLAG indicates if any one of the 4 bits is erroneous.

Figure 2:
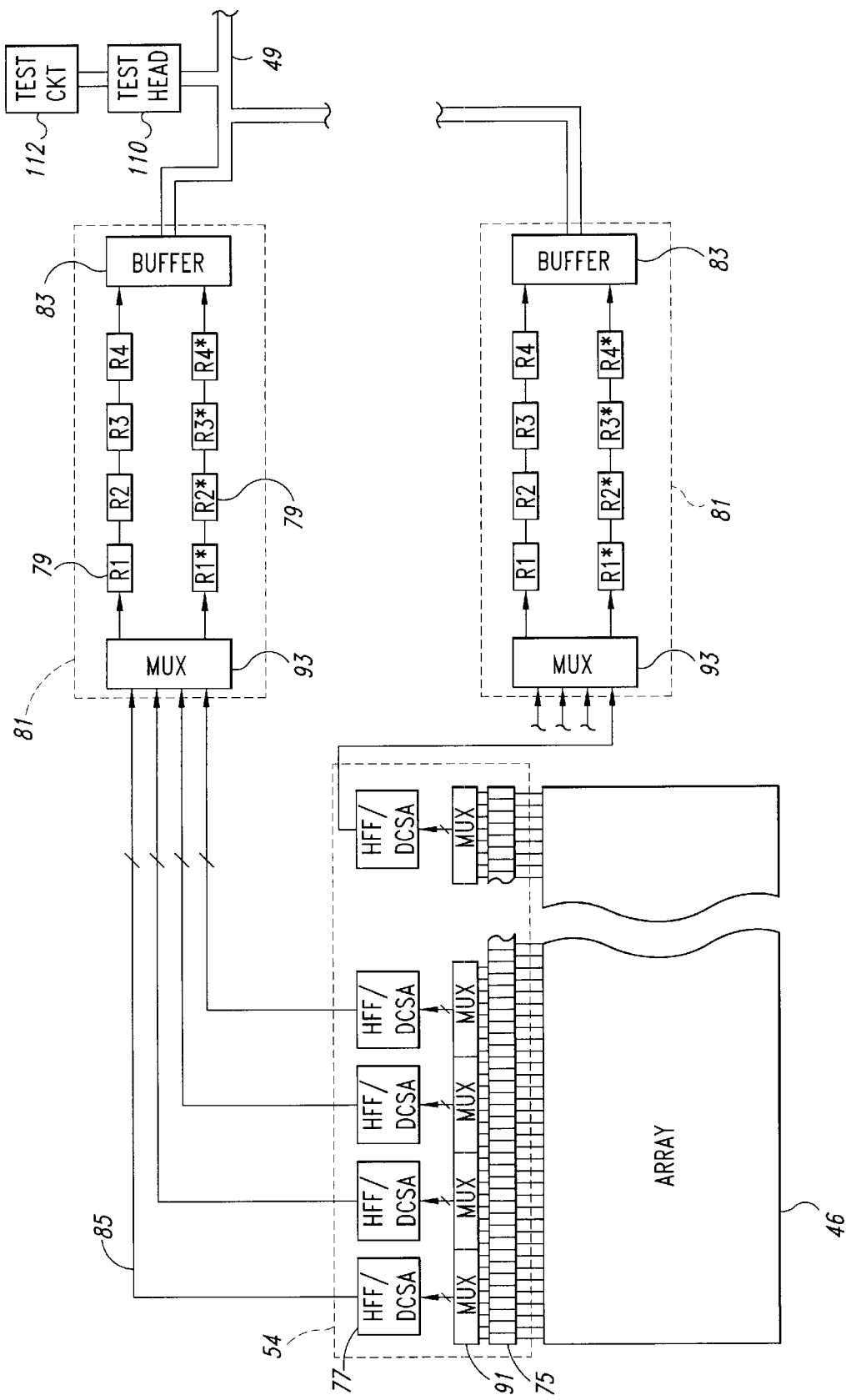
FIG. 2 is a block diagram of an array, I/O gating circuit and an output data path that can be used in the memory device of FIG. 1.

Sixty-four data lines 107 and 16 flag lines 109 connect the I/O interface 54 to the output circuit 81. There, the multiplexers 93 receive the 64 bits of data from the data lines 107 and transfer the data in groups of 16 to the output data registers 79. At the same time, the flag signals FLAG are input directly to 16 corresponding flag registers 98. Because each flag signal FLAG relates to 4 bits of data, only a single flag register 98 is used for each group of four output registers 79, thereby reducing the number of registers per 4-bit set from 8 (two data registers per bit) to 5 (one data register per bit plus one flag register). Since there are 16 sets of output registers 79 and three registers are eliminated for each of the 16 sets of 4 bits, 48 registers are eliminated relative to the embodiment of FIG. 2. Also, only 80 lines (64 data lines and 16 flag lines) are used to couple the data from the I/O interface circuit 54 to the output circuit 81 as compared to 128 lines in the embodiment of FIG. 3. One skilled in the art will recognize that, in some applications, it may be desirable to use four flag registers 98 so that the output registers 79 and flag registers 98 can be controlled by common clock signals, thereby simplifying timing considerations.

Responsive to the output signal LATCHR, the data in each group of 4 output registers 79 are transferred sequentially from the output registers 79 to the tri-state output buffer 83. At the same time, the output from the flag register 98 (not shown) is applied to an enable input of the respective tri-state output buffer. If the flag signal FLAG is true, the tri-state output buffer 83 is disabled and provides an error indication to the data bus 49. The error indication is a tri-state output, i.e., a floating, high impedance. A test head 110 (FIG. 3) monitors the data bus 49, and responsive to the tri-state output, registers the data as invalid. Additional test circuitry 112 receives the information from the test head 110 and indicates that the corresponding four columns include a defective column. The defective four columns can then be replaced by a set of four redundant columns.

In the absence of the comparing circuit 89 and flag signal FLAG, the test head 110 and test circuitry 112 may have difficulty at high frequencies. This difficulty can arise from the speed with which the test head 110 can detect the tri-state output from the output buffer 83. Because the tri-state condition is identified by its high impedance, the test head 110 identifies the error indicator by monitoring the output impedance of the tri-state output buffer 83. However, capacitance and inductance in the test head 110, cabling, and in the tri-state output buffer 83 limit the speed with which the output impedance of the tri-state output buffer 83 can be detected.

This problem is made even more difficult by the use of four register sets 79 triggered by the read latch signal LATCHR that allow transfer of data at each "tick" (i.e., rising or falling edge) of the external clock signal CKEXT. Because the 4 bits of data from the output data registers 79 are output over only two clock cycles, each of the 4 data bits will have approximately one-half of a clock cycle for the tri-state output buffer 83 to present data to the data bus 49.

In a conventional approach, if only one of the column lines is defective, the tri-state condition would be present for only one-half of a clock cycle, and the test head 110 would have very little time to identify the tri-state condition. In fact, this available time would actually be even less than a half clock cycle due to the switching time of the tri-state output buffer 83. Consequently, at very high speed operation, the testing system may incorrectly identify a tri-state output as a valid output.

To allow extra time for the test system to identify the tri-state output, the flag signal FLAG remains true for all 4 ticks (i.e., two cycles) of the data clock DCLK thereby causing the tri-state buffer 83 to produce the tri-state output for two clock cycles. The test head 110 can more easily identify the presence of the tri-state condition because the tri-state condition is present at the output of the driver 100 for two clock cycles, rather than only one-half clock cycle.

Figure 5:
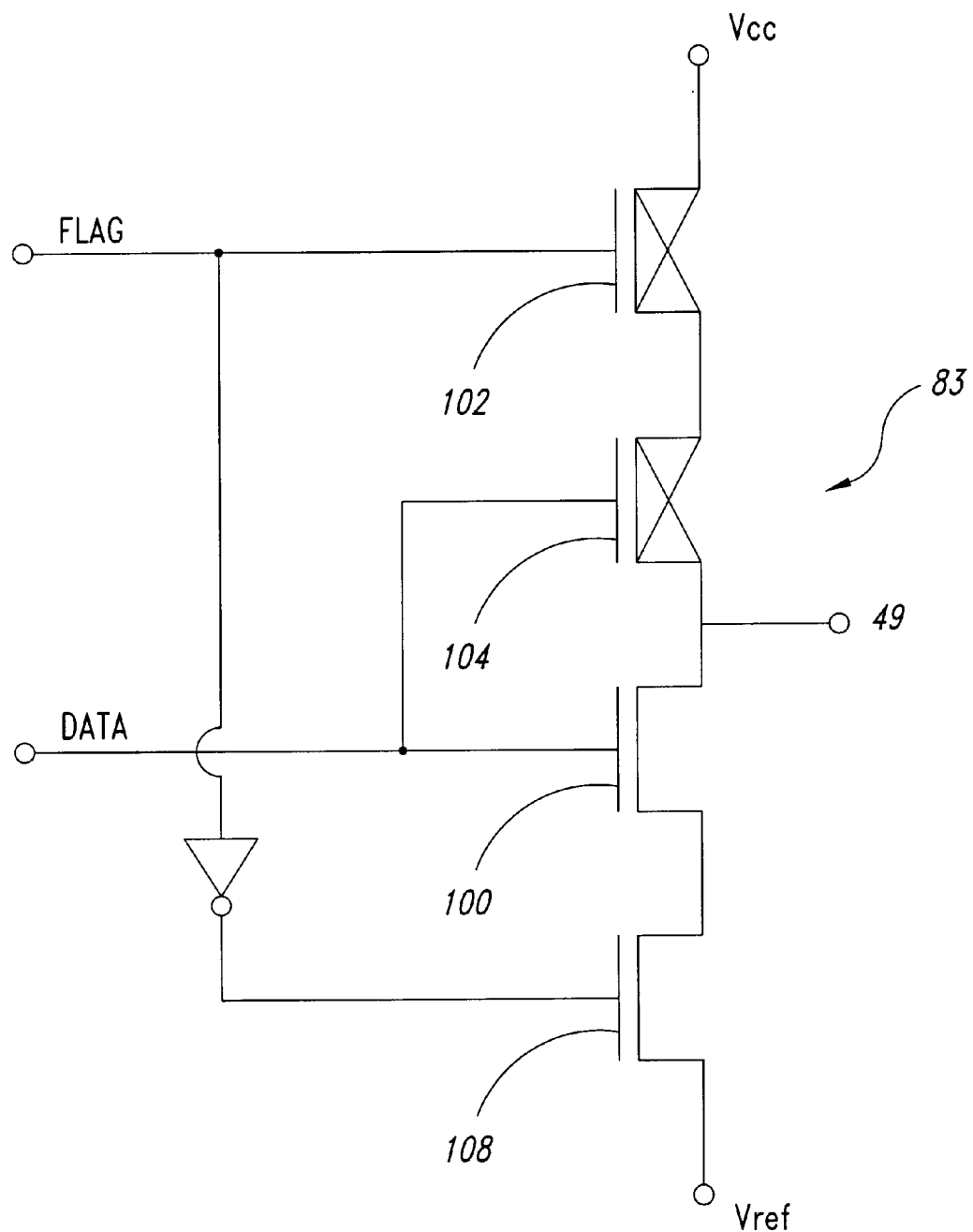
FIG. 5 is a schematic of one embodiment of an output driver for use in the output data path of FIG. 4.

FIG. 5 shows one circuit suitable for use as the tri-state output buffer 83. The tri-state output buffer 83 of FIG. 5 includes 4 transistors 102, 104, 106, 108 serially coupled between the supply voltage $V_{CC}$ and the reference voltage $V_{REF}$. The upper two transistors 102, 104, are PMOS transistors, while the lower two transistors 106, 108 are NMOS transistors. The uppermost and lowermost transistors 100, 102 receive the flag signal FLAG from the flag register 98. The middle two transistors 104, 106 are driven by the output of the register 79 and an inverted version of the register output, respectively. One skilled in the art will recognize that if the flag signal FLAG is high, the transistors 102, 108 will be OFF and the output of the tri-state buffer 83 will be an open circuit. If the latched flag signal FLAG is low, the transistors 102, 108 will be ON. The output voltage will then be controlled by the data from the registers 100. If one of the registers 79 outputs a high signal, the lower PMOS transistor 104 will be OFF and the upper NMOS transistor 106 will be ON. Consequently, the buffer output will equal the reference voltage $V_{REF}$. If the output from the register 79 is low, the lower PMOS transistor 104 will be ON and the upper NMOS transistor 106 will be OFF. Consequently, the output from the output buffer 83 will be the supply voltage $V_{CC}$.

Figure 6:
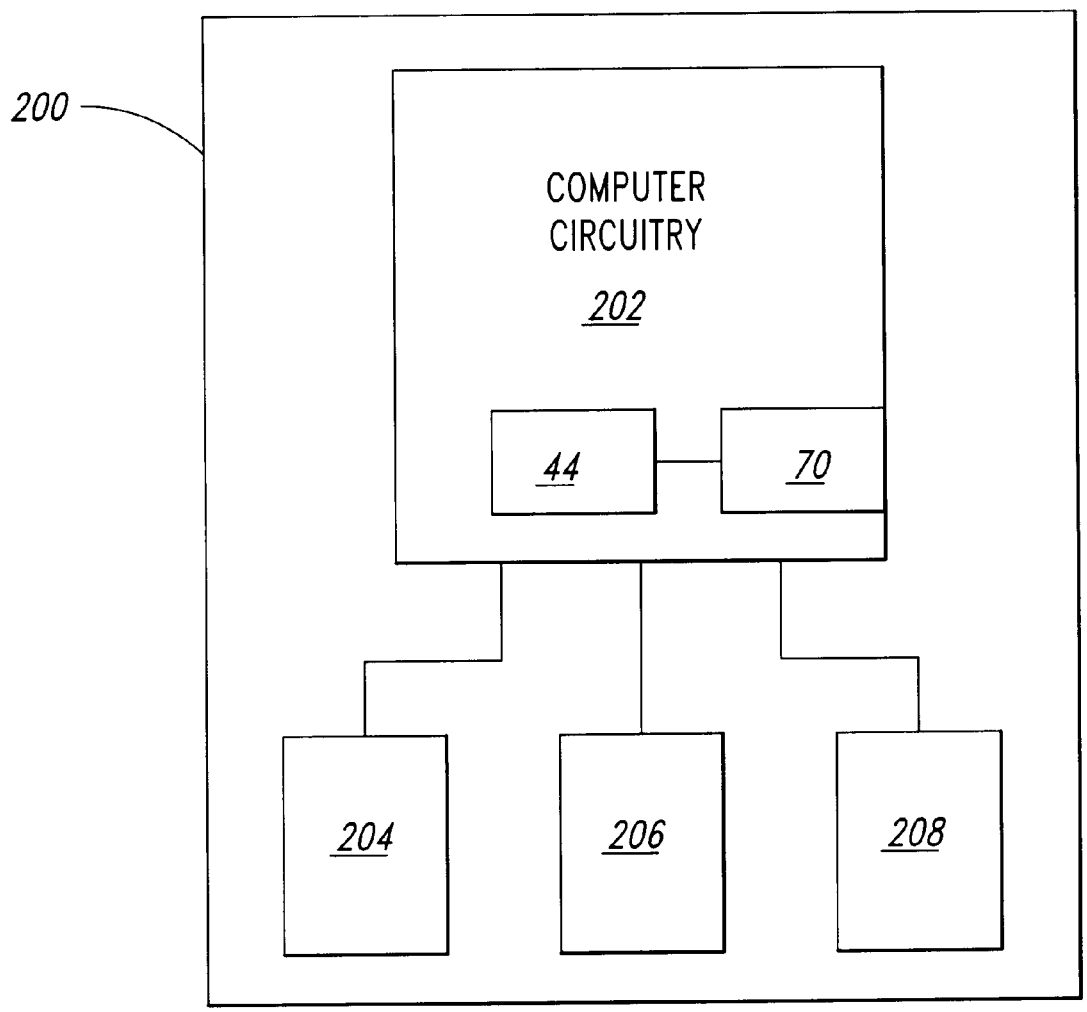
FIG. 6 is a block diagram of a computer system including the memory controller and memory device of FIG. 3.

FIG. 6 is a block diagram of a computer system 200 that contains the memory device 70. The computer system 200 includes computer circuitry 202, such as a microprocessor, for performing computer functions such as executing software to perform desired calculations and tasks and for controlling the memory controller 44. One or more input devices 204, such as a keypad or a mouse, are coupled to the processor 202 and allow an operator to manually input data thereto. One or more output devices 206 are coupled to the processor 202 to display or otherwise output data generated by the processor 202. Examples of output devices include a printer and a video display unit. One or more data storage devices 208 are coupled to the processor to store data on or retrieve data from external storage media (not shown). Examples of storage devices 208 and storage media include drives that accept hard and floppy disks, tape cassettes and compact-disk read-only memories.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A memory device, comprising:
   an output driver circuit having a data output terminal adapted for coupling to a data bus, an error input terminal and a data input terminal, the output driver circuit being operative to produce a tri-state output signal in response to an error signal at the error input terminal and to produce output data corresponding to input data in the absence of the error signal;
   a memory array having a plurality of memory cells arranged in rows and columns;
   an I/O interface coupled to the array, the I/O interface being configured to read data from a plurality of memory cells in the memory array;
   a data path coupled between the I/O interface and the data input terminal of the output driver circuit;
   a comparing circuit coupled to the I/O interface, the comparing circuit comparing the data read from the plurality of memory cells to error criteria and producing the error signal in response to the data meeting the error criteria; and
   an error line coupled between the comparing circuit and the error input terminal.

2. The memory device of claim 1 wherein the I/O interface is substantially adjacent to the memory array.

3. The memory device of claim 2 wherein the comparing circuit is substantially adjacent to the memory array.

4. The memory device of claim 1, further including an error register coupled between the error line and the error input terminal.

5. The memory device of claim 1, further comprising a multiplexer coupled between the I/O interface and the data paths.

6. The memory device of claim 1, further comprising a plurality of data registers coupled between each of the data paths and the output driver circuit.

7. The memory device of claim 6 wherein the data registers are serially coupled.

8. The memory device of claim 6, further comprising a multiplexer coupled between a first plurality of the data paths and a first of the registers.

9. The memory device of claim 1 wherein the comparing circuit is configured to compare a plurality of read data to a select pattern of read data to identify the error condition.

10. A computer system comprising:
    a processor;
    an input device coupled to the processor;
    an output device coupled to the processor;
    a storage device coupled to the processor;
    a data bus coupled to the processor; and
    a memory device, including:
      an output driver circuit having a data output terminal coupled to the data bus, an error input terminal and a data input terminal, the output driver circuit being operative to produce a tri-state output signal in response to an error signal at the error input terminal and to produce output data corresponding to input data in the absence of the error signal;

a memory array having a plurality of memory cells arranged in rows and columns;

an I/O interface coupled to the array, the I/O interface being configured to read data from a plurality of memory cells in the memory array;

a data path coupled between the I/O interface and the data input terminal of the output driver circuit;

a comparing circuit coupled to the I/O interface, the comparing circuit comparing the data read from the plurality of memory cells to error criteria and producing the error signal in response to the data meeting the error criteria; and an error line coupled between the comparing circuit and the error input terminal.

11. The computer system of claim 10 wherein the I/O interface is substantially adjacent to the memory array.

12. The computer system of claim 10 wherein the comparing circuit is substantially adjacent to the memory array.

13. A test system including:

a memory device including:

an output driver circuit having a data output terminal adapted for coupling to a data bus, an error input terminal and a data input terminal, the output driver circuit being operative to produce a tri-state output signal in response to an error signal at the error input terminal;

a memory array arranged in rows and columns;

an I/O interface coupled to the array, the I/O interface being configured to read data from a plurality of rows or columns, the I/O interface including a plurality of output terminals;

a plurality of data paths coupled between the I/O interface and the output driver circuit;

a comparing circuit coupled to the I/O interface, the comparing circuit being responsive an error condition at the I/O interface to produce the error signal;

an error line coupled between the comparing circuit and the error input terminal;

a test head adapted for coupling to the output driver circuit, the test head for detecting the tri-state condition of the output driver circuit; and testing circuitry coupled to the test head.

14. The system of claim 13 wherein the memory device further comprises a multiplexer coupled between the I/O interface and the data paths.

15. The test system of claim 13 wherein the memory device further comprises a plurality of data registers coupled between each of the data paths and the output driver circuit.

16. The test system of claim 15 wherein the data registers are serially coupled.

17. The test system of claim 13 wherein the comparing circuit is configured to compare a plurality of read data to a select pattern of read data to identify the error condition.

18. A data transfer circuit coupled between a memory array containing a plurality of memory cells arranged in rows and columns, and a least one data output terminal, the data transfer circuit comprising:

a read circuit adapted for coupling to the memory array and having a data output terminal and an error signal output, the read circuit being responsive to a test read command to output data at the data output terminal from a plurality of the memory cells, and to output an error signal at the error output during the time that the read data is being output from the memory array if the read data is in error;

an output driver circuit having an error input terminal, a data input terminal and an output terminal adapted for coupling to a respective data output terminal, the driver circuit to produce an output signal corresponding to the output data responsive to the absence of the error signal and to produce an output signal corresponding to an error condition responsive to the error signal;

a data line extending between the read circuit data output terminal and the data input terminal of the output driver circuit; and an error line extending between the error output and the error input terminal.

19. The data transfer circuit of claim 18 wherein the reading circuit includes a comparing circuit configured to compare the output data signals to a desired pattern and to produce the error signal in response thereto.

20. The data transfer circuit of claim 18 wherein the data lines are single-ended data lines.

21. The data transfer circuit of claim 20 wherein the error line is a single-ended data line.

22. The data transfer circuit of claim 18, further including a plurality of output data registers coupled between the data lines and the output driver circuit.

23. The data transfer circuit of claim 22, further including an error register coupled between the error line and the error input terminal.

24. The data transfer circuit of claim 23 wherein the number of data registers is greater than the number of error registers.

25. The data transfer circuit of claim 18 wherein the output driver circuit includes a tri-state buffer.

26. The data transfer circuit of claim 25 wherein the tri-state buffer is responsive to the error signal to produce a tri-state output.

* * * * *

UNITED STATES PATENT AND TRADEMARK OFFICE
CERTIFICATE OF CORRECTION

PATENT NO. : 6,014,759
DATED : January 11, 2000
INVENTOR(S) : Troy A. Manning

Page 1 of 1

It is certified that error appears in the above-identified patent and that said Letters Patent is hereby corrected as shown below:

Column 2,
Line 22, "5,631,871" should be -- 5,631,872 --

Signed and Sealed this

Sixteenth Day of April, 2002

Attest:

JAMES E. ROGAN
*Attesting Officer*     *Director of the United States Patent and Trademark Office*